United States Patent
Lloyd

(10) Patent No.: US 10,097,139 B2
(45) Date of Patent: Oct. 9, 2018

(54) METHODS FOR MULTI-PATH AMPLIFIERS AND MULTI-PATH AMPLIFIER

(71) Applicant: Rohde & Schwarz GmbH & Co. KG, München (DE)

(72) Inventor: Gareth Lloyd, München (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/499,851

(22) Filed: Apr. 27, 2017

(65) Prior Publication Data

US 2018/0076773 A1 Mar. 15, 2018

(30) Foreign Application Priority Data

Sep. 14, 2016 (EP) .................... 16188790

(51) Int. Cl.
| | |
|---|---|
| H03F 1/02 | (2006.01) |
| H03F 3/21 | (2006.01) |
| H03F 3/26 | (2006.01) |
| H03F 3/19 | (2006.01) |
| G06F 17/50 | (2006.01) |

(52) U.S. Cl.
CPC ....... *H03F 1/0288* (2013.01); *G06F 17/5063* (2013.01); *H03F 3/19* (2013.01); *H03F 3/211* (2013.01); *H03F 3/26* (2013.01); *H03F 2200/451* (2013.01); *H03F 2203/21106* (2013.01); *H03F 2203/21145* (2013.01)

(58) Field of Classification Search
CPC ............................ H03F 1/0288; G06F 17/0563
USPC ...................................... 330/124 R
See application file for complete search history.

(56) References Cited

U.S. PATENT DOCUMENTS

| | | | | |
|---|---|---|---|---|
| 5,093,667 | A | * | 3/1992 | Andricos ................ G01S 7/032 330/130 |
| 5,610,554 | A | * | 3/1997 | Anvari ................... H03F 1/3235 330/151 |
| 6,313,703 | B1 | * | 11/2001 | Wright .................. H03F 1/0294 330/124 R |

(Continued)

FOREIGN PATENT DOCUMENTS

| | | |
|---|---|---|
| EP | 1 463 198 A2 | 9/2004 |
| WO | WO 2007/078217 A1 | 7/2007 |
| WO | WO 2007/117189 A1 | 10/2007 |

OTHER PUBLICATIONS

Extended European Search Report for European Application No. 16188790.6 (dated Mar. 23, 2017).

(Continued)

*Primary Examiner* — Patricia T Nguyen
(74) *Attorney, Agent, or Firm* — Shumaker & Sieffert, P.A.

(57) ABSTRACT

A design method for designing a multi-path amplifier involves connecting an amplifier stage having at least two amplifier branches to a combiner stage; feeding a plurality of testing signals with one or more of a plurality of sweeping variables to the amplifier stage; measuring output signals at the output of the combiner stage depending on the plurality of testing signals; designing a structure of an input network stage for the amplifier stage on the basis of the measured output signals; and combining the designed input network stage with the amplifier stage to create an efficiency-optimized multi-path amplifier.

16 Claims, 1 Drawing Sheet

(56) References Cited

U.S. PATENT DOCUMENTS

| | | | |
|---|---|---|---|
| 6,683,495 B2* | 1/2004 | Johnson | H03F 1/3229 330/124 R |
| 7,084,703 B2* | 8/2006 | Cavers | H03F 1/3229 330/149 |
| 7,126,422 B2* | 10/2006 | Suzuki | H03F 1/3223 330/149 |
| 8,354,882 B2 | 1/2013 | Blednov | |
| 8,653,890 B1* | 2/2014 | Ahmed | H03F 1/0222 330/107 |
| 2003/0001669 A1 | 1/2003 | Billsberry | |
| 2006/0238246 A1* | 10/2006 | Ishigami | H03F 1/3223 330/151 |
| 2009/0315622 A1* | 12/2009 | Suzuki | H03F 1/0261 330/124 R |
| 2014/0085000 A1 | 3/2014 | Dalisda et al. | |
| 2015/0116039 A1 | 4/2015 | Ahmed et al. | |

OTHER PUBLICATIONS

"Doherty amplifier," Wikipedia, the free encyclopedia, https://en.wikipedia.org/wiki/Doherty_amplifier, pp. 1-2 (May 17, 2017).

"Schiffman Phase Shifters," Microwaves101.com, https://www.microwaves101.com/encyclopedias/schiffman-phase-shifters, pp. 1-3 (accessed on Sep. 8, 2017).

"Wilkinson power splitters," Microwaves101.com, https://www.microwaves101.com/encyclopedias/wilkinson-power-splitters, pp. 1-4 (accessed on Sep. 8, 2017).

\* cited by examiner

METHODS FOR MULTI-PATH AMPLIFIERS AND MULTI-PATH AMPLIFIER

PRIORITY CLAIM

This application claims the benefit of European Patent Application No. 16188790.6, filed Sep. 14, 2016; the disclosure of which is incorporated herein by reference in its entirety.

FIELD OF THE INVENTION

The present invention relates to design methods for multi-path amplifiers and multi-path amplifiers being designed according to such methods. The multi-path amplifiers may in particular be employed in Doherty or Chireix amplifier topologies, but may also be applicable to other amplifier types such as, but not limited to, push-pull amplifiers, balanced amplifiers or spatially combined amplifiers. Such multi-path amplifiers may in particular be implemented in transmit frontend (TxFE) devices, as for example employed in mobile communication devices or mobile computing devices.

BACKGROUND OF THE INVENTION

Doherty power amplifier architectures are increasingly used as replacement for more traditional Class B amplifier in base-station and broadcast applications. Doherty amplifiers are simple in construction and highly efficient in performance. However, despite of its success, practicable implementations of Doherty power amplifier architectures may be rather limited in RF bandwidth, a problem that tends to be exacerbated towards higher power levels.

With Doherty power amplifier architectures being widespread due to their increased efficiency performance, linearity and operating bandwidth are typically deteriorated. Class C biased peaking amplifiers may causes AM-PM distortion, thereby limiting the overall amplifier linearity. Additionally, combiner devices for the output power are often regarded as the constraining factor for achievable RF bandwidth. Doherty power amplifier architectures are typically used in narrowband scenarios and commonly accompanied by pre-distortion input circuitry.

Specifically in frontend applications Doherty power amplifier architectures have become the quasi-linear architecture of choice. As microwave or millimeter wave air interface become more common, particularly with the advent of 5G communication technologies, the conventionally used amplifier classes as constituents of the Doherty architecture impose severe restrictions to its applicability which have hitherto been tried to address with different approaches.

Document WO 2007/117189 A1 discloses a method and a system for compensating signal distortions in multiple transmitting branches of a composite amplifier. Document WO 2007/078217 A1 discloses a detuned composite amplifier with a nonlinear drive function having a phase that varies with the composite amplifier output voltage amplitude and being configured to transform the output voltage transition point into an extended output voltage transition region to increase the efficiency of the composite amplifier. Document US 2014/0085000 A1 discloses a Doherty-type amplifier with a main-amplifier circuit, an auxiliary-amplifier circuit and a signal-generating device. Document US 2015/0116039 A1 discloses a multi-path amplifier system with an adjustable power splitter. Document U.S. Pat. No. 8,354,882 B2 discloses a Doherty amplifier with an optimized input network for MMIC integration.

SUMMARY OF THE INVENTION

According to the disclosure of present invention methods for designing a multi-path amplifier and multi-path amplifiers having been designed according to such methods may be implemented.

Specifically, according to a first aspect of the invention, a method for designing a multi-path amplifier involves connecting an amplifier stage having at least two amplifier branches to a combiner stage; feeding a plurality of testing signals with one or more of a plurality of sweeping variables to the amplifier stage; measuring output signals at the output of the combiner stage depending on the plurality of testing signals; designing a structure of an input network stage for the amplifier stage on the basis of the measured output signals; and combining the designed input network stage with the amplifier stage to create an efficiency-optimised multi-path amplifier.

According to a second aspect of the invention, a multi-path amplifier includes an input network having at least one input terminal and at least two output terminals, the at least two output terminals being connected to respective amplifier branches of the multi-path amplifier. The input network has been designed according to the method of the first aspect of the invention.

In some embodiments, the sweeping variables include one or more of frequency, differential input amplitude, differential input phase and absolute input power.

In some embodiments, the measured output signals include one or more of current consumption, channel output power, adjacent channel power and output crest factor.

In some embodiments, measuring the output signals comprises checking the current output signals against a list of boundary conditions for the measured output signals in order to minimize time waster performing measurements.

In some embodiments, designing the structure of the input network stage (2) includes one or more of a general filter construction technique, a discrete filter component synthesis, a distributed filter component synthesis, a rat-race hybrid, a cascaded rat-race hybrid with a Schiffman phase shifter and a Schiffman phase shifter.

In some embodiments, the design of the input network stage includes at least two output terminals.

In some embodiments, the design of the input network stage includes an analog processing module.

In some embodiments, the design of the input network stage includes one or more of an attenuator, a differential phase shifter, a power splitter and a hybrid coupler.

In some embodiments, designing the structure of the input network stage involves designing at least two output terminals having power linear output with respect to each other.

In some embodiments, the design of the input network stage includes a Wilkinson splitter.

One idea of the present invention is to provide hardware prototypes of the amplifier stage and the combiner stage of a multi-path amplifier early in the development phase. Those components necessarily suffer from imperfections and deviations from ideal parameters. The hardware prototypes of the amplifier stage and the combiner stage are subject to extensive empirical multi-dimensional testing. The testing results are used to subsequently compensate the imperfections during design of the input network stage.

Amongst others, there are several specific advantages associated with such design methods and the concomitantly designed multi-path amplifiers.

The input network stage may include various components such as power splitters, hybrid couplers, attenuators and/or phase shifters. Those components may be passive components, the design, specification and parameters of which may be chosen taking into account the obtained testing results. The input network stage may for example be synthesized to re-create optimum values for differential amplitude and phase over frequency at the output of the resulting multi-path amplifier. Advantageously, frequency-domain equalization may be achieved by adapting the input network stage design considerations to the imperfections of the amplifier stage and the combiner stage.

The extensive empirical multi-dimensional testing may be performed rapidly by using vector signal generators at the input end and signal and spectrum analyzers at the output end of the truncated prototype multi-path amplifier with the prototype amplifier stage and the prototype combiner stage only. A rapid measurement scheme may be driven by using a rapid test executive software.

Deliberately modifying the design of the input network stage to have a characteristic that is not constant over frequency may allow for a final design to be achieved that is tailored towards an optimum output under the given imperfections of the amplifier stage and/or the combiner stage. Performance improvements may be achieved by optimizing the input network stage to accommodate dispersions in the amplifier stage and combiner stage, effectively performing a frequency domain equalization.

This design technique becomes increasingly important as the Doherty concept rolls out in 5G and other millimeter wave frequency applications. At these higher frequencies, the sub-circuits have the potential to significantly increase in electrical size which, in turn, may cause increased frequency dispersion and degraded bandwidth.

The performance gain that may be achieved using the design methodology of the invention is in particular not limited by the model accuracy, the modelling methodology or dispersive effects in the sub-components of the amplifier and combiner stages, but instead maps the empirically gathered imperfections of the underlying hardware to obtain specifically designed hardware components of the input network stage. Thus, the finally obtained multi-path amplifier does not need any actively controlled elements and the complexity of the input network stage is accordingly reduced.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the accompanying drawings. Elements in the drawings are illustrated for simplicity and clarity and have not necessarily been drawn to scale.

In all figures of the drawings elements, features and components which are the same or at least have the same functionality have been provided with the same reference symbols, unless explicitly stated otherwise.

DETAILED DESCRIPTION OF SOME EMBODIMENTS OF THE INVENTION

Figure 1:
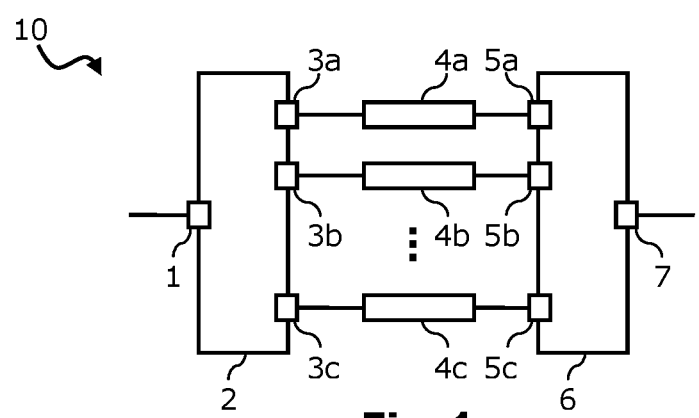
FIG. 1 schematically illustrates a multi-path amplifier according to some embodiments of the invention.

FIG. 1 schematically illustrates a multi-path amplifier 10. The multi-path amplifier 10 may be any type of amplifier that employs at least two amplifier branches in parallel. The multi-path amplifier 10 may for example comprise a Doherty amplifier, a balanced amplifier, a push-pull amplifier or a spatially combined amplifier. The general functionality of the multi-path amplifier 10 is to provide for an output current sourced by one of the amplifier branches which is discontinuous relative to its drive signal.

Doherty amplifiers have enjoyed a renaissance in recent years in transmitter frontend hardware. Its persistent presence in the literature, including conference proceedings and patent databases, are testament to its elegance and flexibility. To achieve operation as Doherty intended, two broad conditions should be met by the amplifiers and combiners: (i) The output current sourced by the auxiliary amplifier should have a specific characteristic, anyway discontinuous relative to the drive signal; and (ii) the combiner ("impedance inverter") should be 90 degrees length. Despite the efforts devoted to making each of the three sub-circuits, i.e. the input network stage 2, the amplifier stage with the amplifier branches 4a, 4b, 4c, and the combiner stage 6, less dispersive, neither of the two conditions as set out above can be fully met in practice. As a result, the load modulation process is not purely real.

The disclosed architectures for the multi-path amplifiers 10 are not mutually exclusive, i.e. a Doherty amplifier architecture may be constructed using one or more anti-phase amplifiers or push-pull amplifiers. Multiple anti-phase amplifiers may for example be balanced.

The multi-path amplifier 10 as shown in FIG. 1 includes an input network stage 2 having at least one input terminal 1 for receiving input signals and at least two output terminals 3a, 3b, 3c for outputting output signals. In FIG. 1 the number of output terminals 3a, 3b, 3c is exemplarily shown as three, however, it should be understood that another number greater than one may be equally possible for the number of output terminals of the input network stage 2. The input network stage 2 may in some embodiments be formed with passive electric circuitry, for example with resistors, connector lines, inductors and/or capacitors. The input network stage 2 may in some embodiments be formed to output output signals at the output terminals 3a, 3b, 3c which are power linear with respect to each other and with respect to the input signals at the input terminal 1. The input network stage 2 may in some embodiments include an analog processing module. The analog processing module may be formed with analog circuitry components and may be configured to process signals. Moreover, the analog processing module may be implemented in modular form. The input network stage 2 may in some embodiments comprise electric components such as attenuators, phase shifters and/or hybrid couplers. For example, the attenuators may be implemented as T-type or π-type attenuators. The phase shifters may for example be implemented as differential phase shifters, such as for example Schiffmann phase shifters. The analog processing module may in some embodiments be non-adjustable. In some embodiments the analog processing module may be not controllable by a user input or by an adjustment unit.

The output terminals 3a, 3b, 3c of the input network stage 2 are connected to an active load modulation amplifier block having a respective number of amplifier branches 4a, 4b, 4c which are each connected to one of the output terminals 3a, 3b, 3c of the input network stage 2. The number of amplifier branches 4a, 4b, 4c in FIG. 1 is exemplarily shown as three, however, it should be understood that another number greater than one may be equally possible for the number of amplifier branches. The amplifier branches 4a, 4b, 4c form, eventually together with additional components such as bandpass filters, attenuators, switches or similar components, an amplifier stage 4. The amplifier stage 4 may be arranged according to the desired amplifier functionality, such as for example in Doherty type arrangement, in cascaded arrangement of several amplifying modules or the like.

Figure 2:
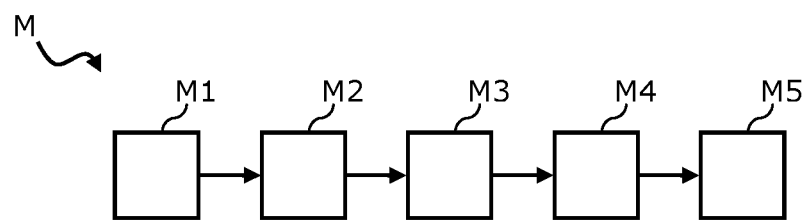
FIG. 2 shows a flowchart of procedural stages of a method for designing a multi-path amplifier according to some other embodiments of the invention.

The design of components of the multi-path amplifier 10 of FIG. 1, specifically the input network 2, will be explained in conjunction with the design method M as depicted in FIG. 2, while resorting to the exemplary amplifier architecture of FIG. 1 for a better understanding of the underlying principles.

FIG. 2 schematically illustrates procedural stages of a design method M for designing a multi-path amplifier. The design method M may be advantageously used for designing a multi-path amplifier 10 as depicted in FIG. 1.

In the design method M, a first step M1 involves connecting an amplifier stage having at least two amplifier branches 4a, 4b, 4c to a combiner stage 6. The amplifier stage and the combiner stage may be hardware prototypes having imperfections in their performance.

In a second step M2, a plurality of testing signals with one or more of a plurality of sweeping variables are fed to the amplifier stage. The sweeping variables may for example include one or more of frequency, differential input amplitude, differential input phase and absolute input power.

In a third step M3, output signals are measured at the output of the combiner stage depending on the plurality of testing signals. The measured output signals may for example include one or more of current consumption, channel output power, adjacent channel power and output crest factor. In order to minimize time wasted performing measurements, measuring the output signals may comprise checking the current output signals against a list of boundary conditions for the measured output signals.

In a fourth step M4, a structure of an input network stage 2 for the amplifier stage is designed on the basis of the measured output signals. This may includes one or more of a general filter construction technique, a discrete filter component synthesis, a distributed filter component synthesis, a rat-race hybrid, a cascaded rat-race hybrid with a Schiffman phase shifter and a Schiffman phase shifter. The input network stage 2 may in particular be designed to include at least two output terminals, an analog processing module, one or more of an attenuator, a differential phase shifter, a power splitter and a hybrid coupler, and/or a Wilkinson splitter.

In a fifth step, the designed input network stage 2 is combined with the amplifier stage to create an efficiency-optimised multi-path amplifier 10.

In order to provide the testing signals, signal libraries may be used. Within each signal library, there is a calibration signal and a plurality of test signals. The calibration signal comprises three 3GPP carriers, each separated by 80 MHz to occupy 160 MHz total. The test signals are single 3GPP carriers, with baseband offsets ranging from −80 MHz to +80 MHz in increments of 10 MHz. Using a baseband frequency sweep with the library of test signals enables a single phase coherence calibration of the two SMW channels for amplitude, phase and time delay. Performing an RF frequency sweep with fixed IF, will require a calibration (amplitude, phase, delay) at different associated LO (local oscillator) frequencies. For an RF frequency sweep, the user may pre-calibrate, store and recall these calibration values (delay, baseband phase and baseband amplitude) for each frequency, to support an even wider bandwidth. The user is, of course, free to create their own signal library and define their own experiment. Signals may be generated using Win-IQSIM2 software or using a vector signal analyzer. Alternatively, the signals may be generated in MATLAB or similar software.

In some embodiments, it may be useful to connect the amplifier stage and the combiner stage, for example by means of connectors that are designed to transfer data in signal form, such as LAN connectors. If the amplifier stage and the combiner stage are not connected by connectors it may prove difficult to transfer signals from the amplifier stage to the combiner stage. In some embodiments, it may also be helpful to connect the amplifier stage and/or the combiner stage to a power supply. This may advantageously aid in providing power to the amplifier stage and/or the combiner stage.

A calibration should be performed to ensure proper alignment in time, phase and amplitude of the output signals at the end of test cables connected to the combiner stage, i.e. that the effect of the test cables needs to be removed. The calibration procedure may already be embedded within QuickStep project files, if QuickStep is used for the measurement run. Within the QuickStep project, the calibration may be performed using a Forum script, enabling easy instrument control within a Phython scripting environment.

A rapid text executive software, such as aforementioned QuickStep may be used to drive the characterization process of the amplifier stage and the combiner stage. A broad, nested loop sweep characterization may be performed. Other characterization methodologies may for example involve searches for operating points of interest. Independently swept variables may for example include frequency, differential input amplitude, differential input phase, bias points and/or absolute input power. Measured dependent output quantities may for example involve current consumption, channel output power, adjacent channel power and/or output crest factor.

The measured values may for example be checked against a list of conditions intended to minimize time wasted performing measurements in operating regions that are unlikely to be of interest. Doing so also reduces the risk of entering potentially damaging operating conditions when applying the testing signals.

The characterization process of the design method M may be made easy by using a vector signal generator and a signal and spectrum analyzer, whilst rapid measurements may be enabled with Quickstep. The optimized input network stage may then designed using a high performance EM simulation tool, such as for example CST Studio Suite. Two different splitter syntheses may be used: A general filter construction technique involving calculating and synthesizing discrete, distributed (or both) filter circuitry components being connected by a Wilkinson splitter, or a distributed method using a cascaded rat-race hybrid and Schiffman phase shifter.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between various elements as shown and described with respect to the drawings may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Also, the invention is not limited to physical devices or units implemented in non-programmable hardware, but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device. Those skilled in the art will recognize that the boundaries between logic or functional blocks are merely illustrative and that alternative embodiments may merge logic or functional blocks or impose an alternate decomposition of functionality upon various logic or functional blocks.

In the description, any reference signs shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried, unless specifically recited in the claim.

Skilled artisans will appreciate that the illustrations of chosen elements in the drawings are only used to help to improve the understanding of the functionality and the arrangements of these elements in various embodiments of the present invention. Also, common and well understood elements that are useful or necessary in a commercially feasible embodiment are generally not depicted in the drawings in order to facilitate the understanding of the technical concept of these various embodiments of the present invention. It will further be appreciated that certain procedural stages in the described methods may be described or depicted in a particular order of occurrence while those skilled in the art will understand that such specificity with respect to sequence is not actually required.

What I claim is:

1. A method for designing a multi-path amplifier, the method comprising:
    connecting an amplifier stage having at least two amplifier branches to a combiner stage;
    feeding a plurality of testing signals with one or more of a plurality of sweeping variables to the amplifier stage;
    measuring output signals at the output of the combiner stage depending on the plurality of testing signals;
    designing a structure of an input network stage for the amplifier stage on the basis of the measured output signals, wherein the input network stage is not controllable or adjustable by a user input and is not controllable or adjustable by an adjusting unit; and
    combining the designed input network stage with the amplifier stage to create an efficiency-optimised multi-path amplifier.

2. The method of claim 1, wherein the sweeping variables include one or more of frequency, differential input amplitude, differential input phase and absolute input power.

3. The method of claim 1, wherein the measured output signals include one or more of current consumption, channel output power, adjacent channel power and output crest factor.

4. The method of claim 1, wherein measuring the output signals comprises checking the current output signals against a list of boundary conditions for the measured output signals in order to minimize time wasted performing measurements.

5. The method of claim 1, wherein designing the structure of the input network stage includes one or more of a general filter construction technique, a discrete filter component synthesis, a distributed filter component synthesis, a rat-race hybrid, a cascaded rat-race hybrid with a Schiffman phase shifter and a Schiffman phase shifter.

6. The method of claim 1, wherein the design of the input network stage includes at least two output terminals.

7. The method of claim 1, wherein the design of the input network stage includes an analog processing module.

8. The method of claim 1, wherein the design of the input network stage includes one or more of an attenuator, a differential phase shifter, a power splitter and a hybrid coupler.

9. The method of claim 1, wherein designing the structure of the input network stage involves designing at least two output terminals having power linear output with respect to each other.

10. The method of claim 1, wherein the design of the input network stage includes a Wilkinson splitter.

11. A multi-path amplifier, comprising:
    a combiner stage;
    an amplifier stage having at least two amplifier branches connected to the combiner stage;
    an input network stage having at least one input terminal and at least two output terminals, the at least two output terminals being connected to respective amplifier branches of the amplifier stage, wherein the input network stage having been designed based on measured output signals at an output of the combiner stage, wherein the measured output signals are based on a plurality of testing signal fed within one or more of a plurality of sweeping variables to the amplifier stage, wherein the designed input network stage is combined with the amplifier stage to create the multi-path amplifier, and wherein the input network stage is not controllable or adjustable by a user input and is not controllable or adjustable by an adjusting unit.

12. The multi-path amplifier of claim 11, wherein the multi-path amplifier is one of a Doherty amplifier, a balanced amplifier, a push-pull amplifier and a spatially combined amplifier.

13. The multi-path amplifier of claim 11, wherein the input network stage is configured to output signals which are power linear to each other.

14. The multi-path amplifier of claim 11, wherein the input network stage is configured to output first signals at a first one of the at least two output terminals and second signals at a second one of the at least two output terminals, the first signals and the second signals not being frequency-constant with respect to each other.

15. The multi-path amplifier of claim 11, wherein the input network stage comprises an analog processing module.

16. The multi-path amplifier of claim 15, wherein the analog processing module comprises analog circuitry components which are configured to process signals.

* * * * *